US012746762B2

(12) United States Patent
Ebihara

(10) Patent No.: US 12,746,762 B2
(45) Date of Patent: Sep. 29, 2026

(54) COATING DEVICE AND IMAGE FORMING SYSTEM

(71) Applicant: Takashi Ebihara, Ibaraki (JP)

(72) Inventor: Takashi Ebihara, Ibaraki (JP)

(73) Assignee: RICOH COMPANY, LTD., Tokyo (JP)

( * ) Notice: Subject to any disclaimer, the term of this patent is extended or adjusted under 35 U.S.C. 154(b) by 58 days.

(21) Appl. No.: 18/948,181

(22) Filed: Nov. 14, 2024

(65) Prior Publication Data

US 2025/0162329 A1 May 22, 2025

(30) Foreign Application Priority Data

Nov. 17, 2023 (JP) ................................ 2023-195710
Jul. 18, 2024 (JP) ................................ 2024-114393

(51) Int. Cl.

*B41J 11/00* (2006.01)
*B05C 1/08* (2006.01)
*B05D 1/00* (2006.01)
*B41J 2/21* (2006.01)
*B65H 37/00* (2006.01)
*G03F 7/16* (2006.01)

(52) U.S. Cl.

CPC ............ *B41J 11/0015* (2013.01); *B05C 1/08* (2013.01); *B05C 1/0873* (2013.01); *B05D 1/005* (2013.01); *B41J 2/211* (2013.01); *B41J 2/2114* (2013.01); *B65H 37/005* (2013.01); *B65H 2301/5114* (2013.01); *G03F 7/162* (2013.01)

(58) Field of Classification Search

CPC ....... B41J 11/0015; B41J 2/211; B41J 2/2114; B05C 1/08; B05C 1/0873; B05D 1/005; B65H 37/005; B65H 2301/5114; G03F 7/162

See application file for complete search history.

(56) References Cited

U.S. PATENT DOCUMENTS

2021/0155015 A1* 5/2021 Akiyama ............ B41J 11/0015

FOREIGN PATENT DOCUMENTS

JP H10-335212 A 12/1998
JP 2014019028 A * 2/2014
JP 2020082033 A * 6/2020

* cited by examiner

*Primary Examiner* — Henok D Legesse
(74) *Attorney, Agent, or Firm* — XSENSUS LLP

(57) ABSTRACT

A coating device is provided that includes: a storage that stores a coating liquid; a pumper that pumps up the coating liquid stored in the storage; a temperature sensor that detects a temperature of the coating liquid stored in the storage; a viscosity sensor that detects a viscosity of the coating liquid stored in the storage; a heating unit that heats the coating liquid stored in the storage; a water supply unit that supplies water to the storage; and circuitry configured to control at least one of the heating unit or the water supply unit based on detection results of the temperature sensor and the viscosity sensor.

8 Claims, 5 Drawing Sheets

COATING DEVICE AND IMAGE FORMING SYSTEM

CROSS-REFERENCE TO RELATED APPLICATIONS

This patent application is based on and claims priority pursuant to 35 U.S.C. § 119 (a) to Japanese Patent Application Nos. 2023-195710 and 2024-114393, filed on Nov. 17, 2023 and Jul. 18, 2024, in the Japan Patent Office, the entire disclosure of each of which is hereby incorporated by reference herein.

BACKGROUND

Technical Field

The present disclosure relates to a coating device and an image forming system.

Related Art

An image forming system has been proposed in which an image forming device such as an inkjet printer and a coating device that applies a coating liquid to an object such as a sheet are installed.

SUMMARY

Embodiments of the present invention provides a coating device including: a storage that stores a coating liquid; a pumper that pumps up the coating liquid stored in the storage; a temperature sensor that detects a temperature of the coating liquid stored in the storage; a viscosity sensor that detects a viscosity of the coating liquid stored in the storage; a heating unit that heats the coating liquid stored in the storage; a water supply unit that supplies water to the storage; and circuitry configured to control at least one of the heating unit or the water supply unit based on detection results of the temperature sensor and the viscosity sensor.

BRIEF DESCRIPTION OF THE DRAWINGS

A more complete appreciation of embodiments of the present disclosure and many of the attendant advantages and features thereof can be readily obtained and understood from the following detailed description with reference to the accompanying drawings, wherein.

Figure 1:
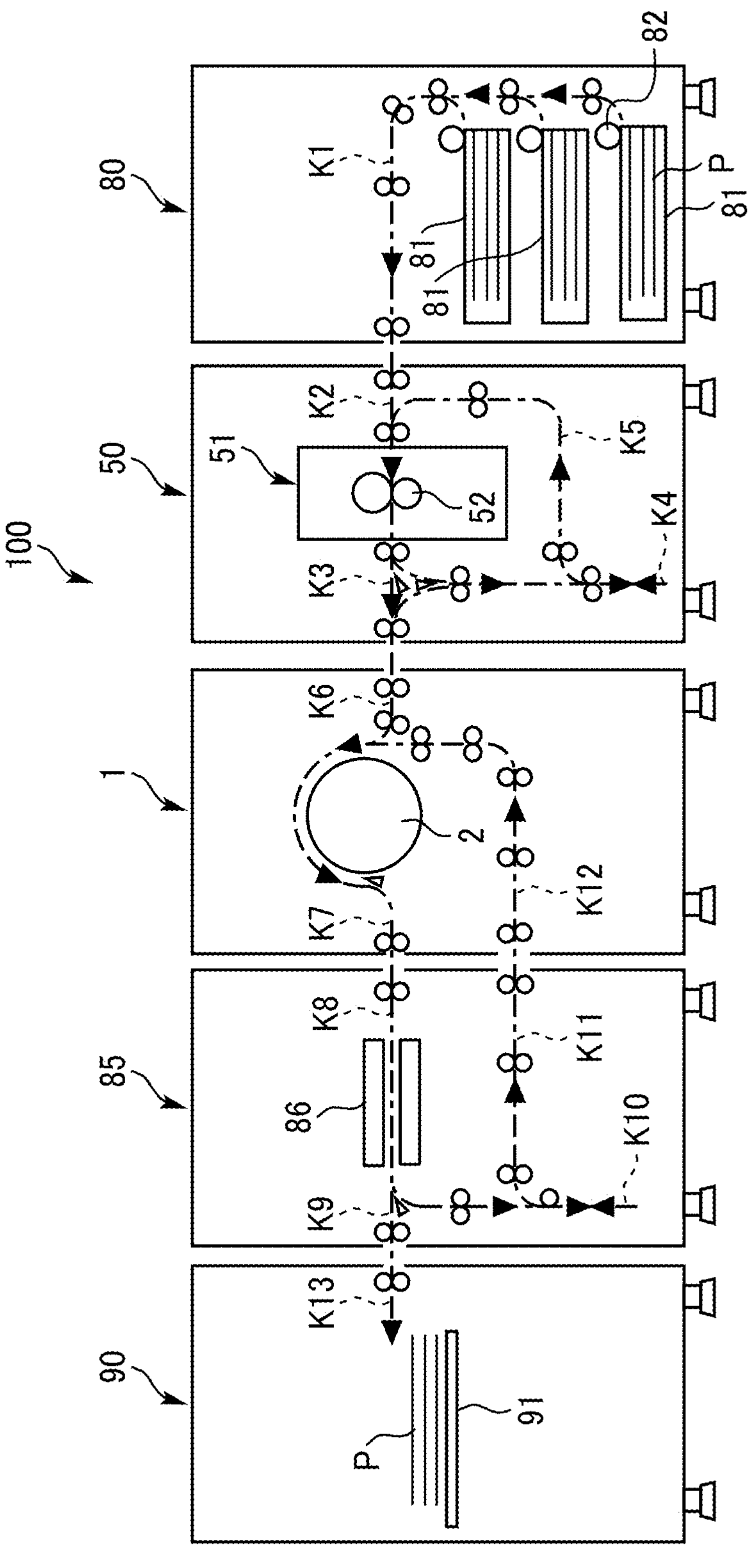
FIG. 1 is an overall diagram illustrating an image forming system according to an embodiment of the present invention.

The accompanying drawings are intended to depict embodiments of the present disclosure and should not be interpreted to limit the scope thereof. The accompanying drawings are not to be considered as drawn to scale unless explicitly noted. Also, identical or similar reference numerals designate identical or similar components throughout the several views.

DETAILED DESCRIPTION

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

Referring now to the drawings, embodiments of the present disclosure are described below. As used herein, the singular forms “a,” “an,” and “the” are intended to include the plural forms as well, unless the context clearly indicates otherwise.

According to embodiments of the present invention, a coating device and an image forming system are provided in which a coating amount of a coating liquid to an object is stabilized.

Embodiments of the present invention are described in detail with reference to drawings. Note that identical reference signs are assigned to identical or equivalent parts and a description of those parts may be simplified or omitted.

First, the entire configuration and operation of an image forming system 100 will be described with reference to FIG. 1.

FIG. 1 illustrates an inkjet printer 1 as an image forming device, a coating device 50 that applies a coating liquid as pretreatment to a sheet P conveyed to the image forming device 1, a sheet feeding device 80 that feeds the sheet P such as paper, a drying device 85 that dries ink on the sheet P after image formation, and a sheet ejection device 90 in which the sheet P ejected from the drying device 85 is stacked.

As illustrated in FIG. 1, in the image forming system 100 according to the present embodiment, the sheet feeding device 80, the coating device 50, the image forming device 1, the drying device 85, and the sheet ejection device 90 are connected in this order from an upstream side.

An operation of the image forming system 100 will be briefly described with reference to FIG. 1.

First, when a print command is input together with image information to a controller of the image forming system 100 from a personal computer or the like, the sheet P is fed from a sheet feeding cassette 81 by a sheet feeding roller 82. The sheet P fed from the sheet feeding cassette 81 is conveyed by a conveyance roller toward the coating device 50 via a first conveyance path K1.

Note that, in the present embodiment, the sheet feeding device 80 is constituted to feed a cut sheet stored in the sheet feeding cassette 81, but the sheet feeding device 80 may be constituted to feed a roll sheet.

Thereafter, the sheet P as an object to be applied (may be referred simply to as “object”) conveyed to the coating device 50 is conveyed to a coating device main part 51 via a second conveyance path K2. Then, the coating device main part 51 applies a coating liquid (pretreatment liquid) for preventing blurring, show-through, and the like to a lower surface of the sheet P (which is a sheet surface to be a front surface at the time of image formation) (this is a coating step). Thereafter, the sheet P to which the coating liquid has been applied is conveyed to a reverse path K4 (fourth conveyance path), and is conveyed to the image forming device 1 via a third conveyance path K3 in a state where the conveyance direction is reversed and the sheet P is reversed (a state where the sheet surface to which the coating liquid has been applied is the front surface (upper surface)).

Here, in a case where a mode for forming images on both sides of the sheet P (double-sided printing mode) is selected in the image forming device 1, the coating liquid is to be applied to both sides of the sheet P. Therefore, the sheet P after the coating liquid has been applied to one side is conveyed to the reverse path K4, the conveyance direction is reversed and tuned over, and then, the sheet P is conveyed to a double-sided path K5 (fifth conveyance path) and conveyed to the coating device main part 51 again. Then, the sheet P including the other surface also coated with the coating liquid by the coating device main part 51 is conveyed as it is to the image forming device 1 via the third conveyance path K3.

Note that the configuration and operation of the coating device main part 51 in the coating device 50 will be described later in detail with reference to FIGS. 3 to 8.

Thereafter, the sheet P conveyed to the image forming device 1 is conveyed to a conveyance drum 2 via a sixth conveyance path K6, and a desired image is formed on the front surface (upper surface) of the sheet P. At this time, since the coating liquid is applied to the front surface of the sheet P as a pretreatment, blurring, show-through, and the like of the image are prevented.

Then, the sheet P on which the image is formed is conveyed to the drying device 85 via a seventh conveyance path K7.

Note that the configuration and operation of the image forming device 1 will be described later in detail with reference to FIG. 2.

Thereafter, the sheet P conveyed to the drying device 85 is conveyed to a dryer 86 via an eighth conveyance path K8, and the image on the sheet P is dried. Then, the sheet P on which the image has been dried is conveyed to the sheet ejection device 90 via a ninth conveyance path K9.

Here, in a case where the double-sided printing mode described above is selected, images are to be formed on both sides of the sheet P. Therefore, the sheet P after the image on one side has been dried is conveyed to a reverse path K10 (a tenth conveyance path), the conveyance direction is reversed and turned over, then, the sheet P is conveyed to double-sided paths K11 and K12 (eleventh and twelfth conveying paths), and conveyed to the conveyance drum 2 of the image forming device 1 again. Then, the sheet P on which a desired image is also formed on the other surface on the conveyance drum 2 is conveyed to the drying device 85 again via the seventh conveyance path K7. Then, the sheet P on the other side of which the image has been dried by the dryer 86 is directly conveyed to the sheet ejection device 90 via the ninth conveyance path K9.

Thereafter, the sheet P conveyed to the sheet ejection device 90 is stacked on a sheet ejection tray 91 after passing through a thirteenth conveyance path K13.

In this way, a series of operations in the image forming system 100 is completed.

Hereinafter, the image forming device 1 (inkjet printer) will be described in detail with reference to FIG. 2.

Figure 2:
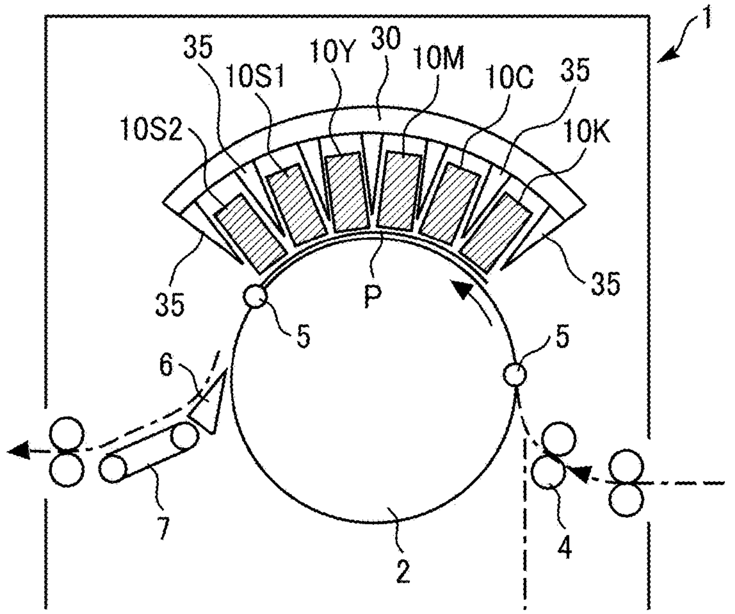
FIG. 2 is a configuration diagram illustrating a main part of an image forming device.

FIG. 2 illustrates the conveyance drum 2 that conveys the sheet P, a clipper 5 that grips the sheet P on the conveying drum 2, a separator 6 that separates the sheet P from the conveyance drum 2, and a conveyance belt 7 that conveys the sheet P separated from the conveyance drum 2.

Heads (printing modules) 10Y, 10M, 10C, 10K, 10S1, and 10S2 each unitize image forming sections for printing and drawing by an inkjet method, and a base frame 30 holds a beam member 35 and the like.

Here, the image forming device 1 according to the present embodiment is for forming a color image, and as illustrated in FIG. 2, the head 10K for black, the heads 10Y, 10M, and 10C for three colors (Yellow, Magenta, Cyan) for colors, and the heads 10S1 and 10S2 for two colors for coating (for special colors) are installed. These six heads 10Y, 10M, 10C, 10K, 10S1, and 10S2 face the conveyance drum 2 with a minute gap therebetween and are radially arranged side by side along a rotation direction of the conveyance drum 2.

Note that the six heads 10Y, 10M, 10C, 10K, 10S1, and 10S2 have substantially the same structure except for the color (type) of ink used for printing. Each of the heads 10Y, 10M, 10C, 10K, 10S1, and 10S2 is a substantially rectangular parallelepiped unit, and a main part thereof is constituted by a piezoelectric actuator, and is provided with a nozzle that discharges ink as liquid (droplet), an ink tank filled with ink, a control board (controller), and the like.

The operation of the image forming device 1 will be briefly described with reference to FIG. 2.

First, when the sheet P is conveyed into the image forming device 1, the sheet P is conveyed toward the conveyance drum 2 by a conveyance roller 4. On the other hand, for the heads 10Y, 10M, 10C, 10K, 10S1, and 10S2 of the respective colors, input image information is converted to write information of the respective colors.

The sheet P conveyed to the conveyance drum 2 is gripped by the clipper 5 and positioned on the conveyance drum 2. The conveyance drum 2 conveys the sheet P while rotating counterclockwise.

Then, the ink as the liquid is sequentially blown from the heads 10Y, 10M, 10C, 10K, 10S1, and 10S2 of the respective colors based on the write information onto the sheet P conveyed in an arrow direction of FIG. 2 by the rotation of the conveyance drum 2, and a desired image is formed on the sheet P.

Thereafter, the sheet P, on which the desired image has been formed, is separated from the conveyance drum 2 by the separator 6. Then, the sheet P separated from the conveyance drum 2 is conveyed by the conveyance belt 7 and further conveyed toward the drying device 85 by the conveyance roller.

Hereinafter, the coating device 50 in the image forming system 100 according to the present embodiment will be described in detail with reference to FIGS. 3 to 8.

The coating device 50 is a device that applies a coating liquid G to the sheet P as an object to be applied.

Figure 4:
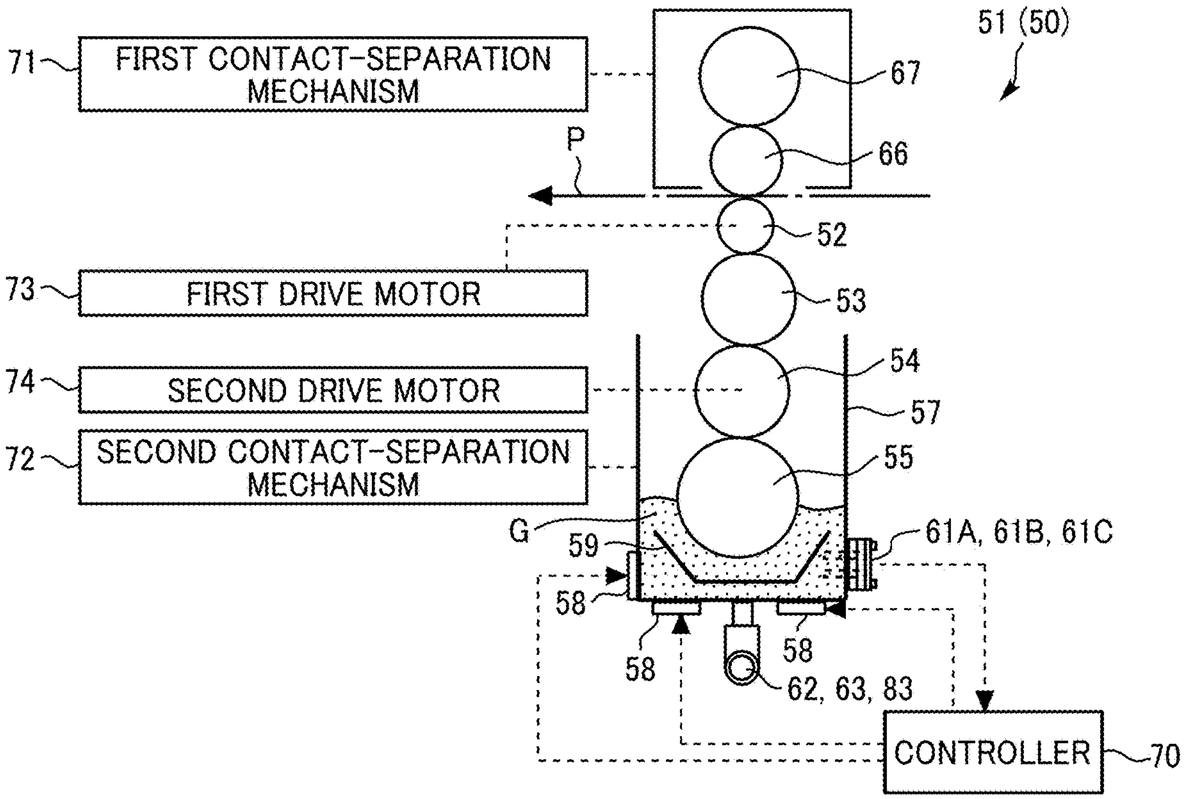
FIG. 4 is a configuration diagram illustrating a main part of a coating device.
Figure 5:
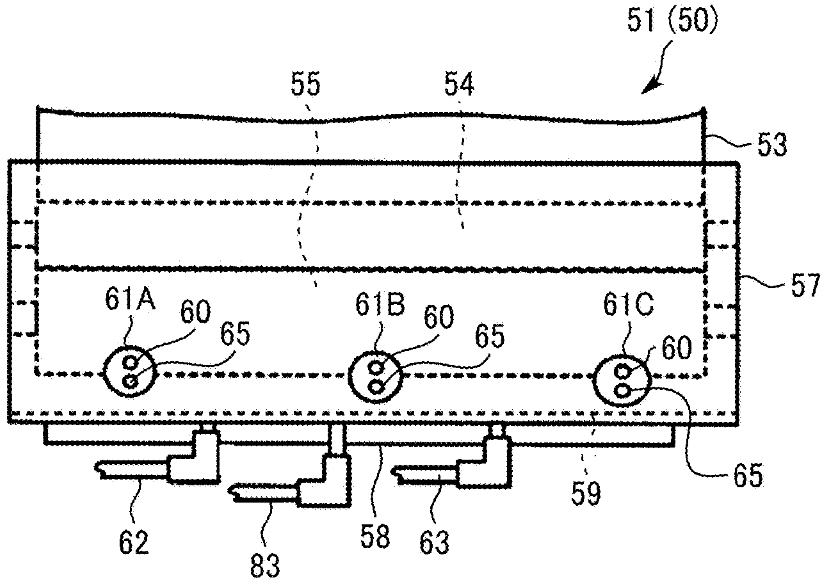
FIG. 5 is a schematic diagram illustrating the main part of the coating device of FIG. 4 in a longitudinal direction.

As illustrated in FIGS. 4 and 5, the coating device 50 (coating device main part 51) in the present embodiment includes a storage 57 in which the coating liquid G is stored, a coating roller 52, an intermediate roller 53, a squeezing roller 54, a pumping roller 55 as a pumper, a pressure roller 66, a pressing roller 67, a heater 58 as a heating unit, a straightening plate 59 (see FIG. 6), a temperature sensor 60 as a temperature detection unit, a viscosity sensor 65 as a viscosity detection unit, and pipes 62, 63, and 83.

Figure 3:
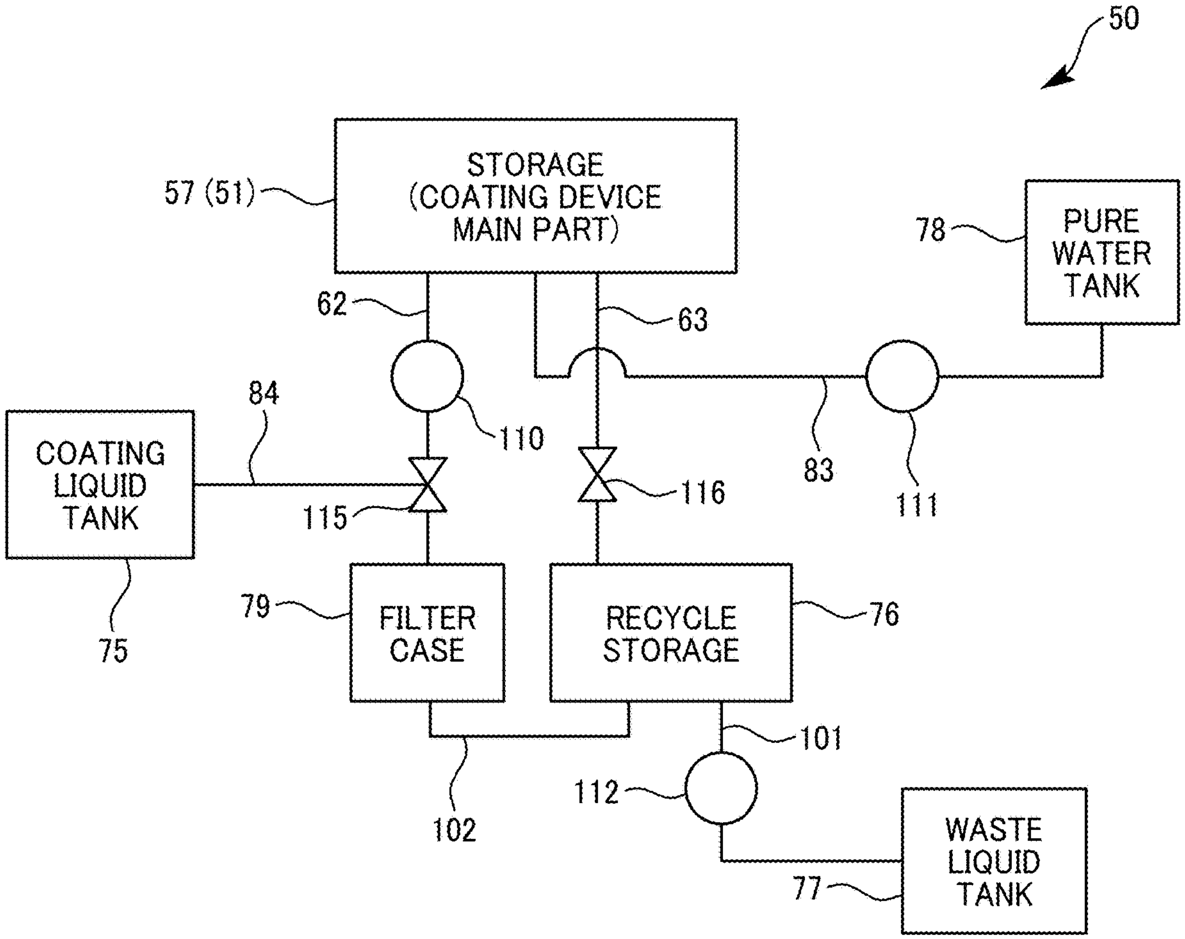
FIG. 3 is a schematic diagram illustrating a supply path and a discharge path of a coating liquid with respect to a storage in a coating device.

Referring to FIG. 3, in the coating device 50, the storage 57 (coating device main part 51), a coating liquid tank 75, a recycle storage 76 (reserve tank), a waste liquid tank 77, a pure water tank 78, a filter case 79, and the like are installed.

The storage 57 is connected to the coating liquid tank 75 in which the new coating liquid G is stored via the supply pipe 62 and a coating liquid supply pipe 84.

In a case where the coating liquid G is supplied to the storage 57 for the first time, a pump 110 is operated to switch a three-way valve 115 so as to fill the storage 57 with the coating liquid G in the coating liquid tank 75 via the supply pipe 62 and the coating liquid supply pipe 84. Then, when the storage 57 is filled with the coating liquid G to a predetermined position, the pump 110 is stopped and the supply of the coating liquid G is interrupted.

Furthermore, during a printing operation (during the coating step), the fresh coating liquid G is appropriately supplied from the coating liquid tank 75 toward the storage 57 along with the consumption of the coating liquid G in the storage 57.

In this manner, the coating liquid tank 75, the supply pipe 62, the coating liquid supply pipe 84, the pump 110, and the three-way valve 115 function as a coating liquid supply unit that supplies the coating liquid G to the storage 57.

Furthermore, the storage 57 is connected to the recycle storage 76 (reserve tank) via the discharge pipe 63. Furthermore, the recycle storage 76 is connected to the storage 57 via a recycle pipe 102, the filter case 79, and the supply pipe 62.

In a case where the printing operation is finished and the coating step is not performed even after a certain period of time has elapsed, or in a case where a main power supply of the image forming system 100 is turned off, an electromagnetic valve 116 is opened, and the coating liquid G in the storage 57 is stored in the recycle storage 76 via the discharge pipe 63 due to a height difference. In this manner, the recycle storage 76, the electromagnetic valve 116, and the discharge pipe 63 function as a coating liquid discharge unit that discharges the coating liquid G from the storage 57.

Then, when the printing operation is started next, the pump 110 is operated to switch the three-way valve 115 so that the coating liquid G in the recycle storage 76 is supplied to the storage 57 via the recycle pipe 102, the filter case 79, and the supply pipe 62. The filter case 79 has a function of removing impurities mixed in the coating liquid G for recycling.

As described above, the recycle storage 76, the pump 110, the three-way valve 115, the recycle pipe 102, the filter case 79, and the supply pipe 62 function as a coating liquid recycle supply unit that supplies the coating liquid G discharged by the coating liquid discharge unit and stored in the recycle storage 76 to the storage 57 again.

Note that, in a case where an amount of the coating liquid G supplied from the recycle storage 76 to the storage 57 as described above is not sufficient, the shortage is supplied from the coating liquid tank 75 to the storage 57.

Furthermore, when it is determined that the storage time of the coating liquid G stored in the recycle storage 76 exceeds a predetermined time even if the printing operation (coating step) is started, the recycle supply from the recycle storage 76 to the storage 57 is not performed, which will be described in detail below.

Furthermore, the recycle storage 76 is connected to the waste liquid tank 77 via a waste liquid pipe 101.

The recycle storage 76 stores the coating liquid G until a predetermined time, but in a case where the coating step is not performed even after the predetermined time has passed, a pump 112 is operated to transfer the coating liquid G in the recycle storage 76 to the waste liquid tank 77 via the waste liquid pipe 101. In this manner, the pump 112, the waste liquid pipe 101, and the waste liquid tank 77 function as a waste liquid discard unit that discards the coating liquid G stored in the recycle storage toward the waste liquid tank 77.

Specifically, in a case where the coating step (that is a step of applying the coating liquid G to the sheet P (object to be applied)) is being performed and a predetermined time T1 has not elapsed since the coating liquid G has been stored in the recycle storage 76, the coating liquid G is supplied to the storage 57 by the coating liquid recycle supply units 62, 76, 79, 102, 110, and 115.

On the other hand, in a case where the coating step is being performed and the predetermined time T1 has elapsed since the coating liquid G has been stored in the recycle storage 76, the coating liquid G is supplied to the storage 57 by the coating liquid supply units 62, 75, 84, 110, and 115, and the coating liquid G stored in the recycle storage 76 is discarded toward the waste liquid tank 77.

Such control is performed in order to avoid a situation in which the coating liquid G stored in the recycle storage 76 deteriorates with the elapsed time and is difficult to use as the coating liquid G for recycling.

Here, as illustrated in FIG. 3, in the present embodiment, the storage 57 is connected to the pure water tank 78 that stores water (pure water) via the water supply pipe 83.

Then, a pump 111 is operated at a predetermined timing to supply the pure water in the pure water tank 78 to the storage 57 via the water supply pipe 83.

In this manner, the pure water tank 78, the water supply pipe 83, and the pump 111 function as a water supply unit that supplies water to the storage 57.

Note that the pure water is supplied from the pure water tank 78 to the storage 57 based on the temperature and viscosity of the coating liquid G stored in the storage 57, which will be described later in detail.

Here, as illustrated in FIGS. 4 and 5, a certain amount of the coating liquid G is stored in the storage 57 of the coating device 50 (coating device main part 51). The storage 57 is a substantially elongated rectangular parallelepiped box-shaped member whose longitudinal direction is a direction perpendicular to a plane on which FIG. 4 is drawn and a left-right direction of FIG. 5.

The pumping roller 55 as a pumper is disposed so as to extend in the longitudinal direction (that is a direction perpendicular to the plane on which FIG. 4 is drawn, is the left-right direction of FIG. 5, and is a rotation axis direction). The pumping roller 55 functions as a pumper that pumps up the coating liquid G stored in the storage 57.

The pumping roller 55 carries the coating liquid G in the storage 57 while rotating in a clockwise direction in FIG. 4. The coating liquid G carried on the pumping roller 55 is adjusted to an appropriate amount at a contact position with the squeezing roller 54 rotating counterclockwise in FIG. 4, and the adjusted coating liquid G is carried on the squeezing roller 54. The coating liquid G carried on the squeezing roller 54 is carried on the coating roller 52 rotating counterclockwise in FIG. 4 via the intermediate roller 53 rotating clockwise in FIG. 4.

Then, the coating liquid G carried on the coating roller 52 is applied to the sheet surface (lower surface) of the sheet P conveyed to a nip portion between the coating roller 52 and the pressure roller 66, (which is the coating step).

At this time, the pressure roller 66 rotates in the clockwise direction in FIG. 4 while being pressed by the pressing roller 67 rotating in the counterclockwise direction in FIG. 4.

As illustrated in FIG. 5, roller portions of the pumping roller 55 and the squeezing roller 54 are formed over substantially the entire area in the longitudinal direction inside the storage 57. Roller portions of the intermediate roller 53, the coating roller 52, the pressure roller 66, and the pressing roller 67 are also formed in substantially the same range in the longitudinal direction. The range in the longitudinal direction is a range including a range in the longitudinal direction of the sheet P having the maximum size that can pass.

Note that a driving force is transmitted from a second drive motor 74 to the pumping roller 55, the squeezing roller 54, and the intermediate roller 53 via a gear train, and the pumping roller, the squeezing roller, and the intermediate roller rotate in predetermined directions, respectively. Furthermore, a driving force is transmitted from a first drive motor 73 to the coating roller 52, the pressure roller 66, and the pressing roller 67 via a gear train, and the coating roller, the pressure roller, and the pressing roller rotate in predetermined directions, respectively.

Furthermore, in the present embodiment, a speed variable motor is used as the second drive motor 74. Then, the rotational speed of the second drive motor 74 is changed by the control of a controller 70 to increase or decrease a peripheral speed difference of the intermediate roller 53 with respect to the coating roller 52, so that the amount of the coating liquid G supplied to the coating roller 52 is increased or decreased to adjust a coating amount of the coating liquid G applied to the sheet P by the coating roller 52.

Furthermore, the pressure roller 66 and the pressing roller 67 are unitized and are integrally movable in a vertical direction of FIG. 4 by a first contact-separation mechanism 71 (cam mechanism) connected to the unitized unit. When the coating step is performed, the pressure roller 66 is moved to a contact position (that is a position in contact with the coating roller 52) illustrated in FIG. 4 by the first contact-separation mechanism 71. On the other hand, when the coating step is not performed, the pressure roller 66 moves to a separated position (that is a position away from the coating roller 52) together with the pressing roller 67 by the first contact-separation mechanism 71. Furthermore, in the present embodiment, when the pressure roller 66 moves to the separated position, a downward biasing force with respect to the coating roller 52 is released, and the coating roller 52 moves slightly upward with respect to the intermediate roller 53 installed at a fixed position.

Furthermore, the pumping roller 55, the squeezing roller 54, the storage 57, and the like are unitized as a storage unit, and are integrally movable in the vertical direction of FIG. 4 by a second contact-separation mechanism 72 (cam mechanism) connected to the storage unit. Then, when it is desired to increase a supply amount of the coating liquid G from the squeezing roller 54 to the intermediate roller 53 to increase the coating amount of the coating liquid G applied to the sheet P by the coating roller 52, the storage unit is moved upward in FIG. 4 by the second contact-separation mechanism 72 to increase a contact pressure of the squeezing roller 54 against the intermediate roller 53. On the other hand, when it is desired to reduce the supply amount of the coating liquid G from the squeezing roller 54 to the intermediate roller 53 to reduce the coating amount of the coating liquid G applied to the sheet P by the coating roller 52, the storage unit is moved downward in FIG. 4 by the second contact-separation mechanism 72 to reduce the contact pressure of the squeezing roller 54 against the intermediate roller 53.

Furthermore, a plurality of pipes (the supply pipe 62, the discharge pipe 63, and the water supply pipe 83) is connected to a bottom portion of the storage 57. These pipes 62, 63, and 83 function as described above with reference to FIG. 3.

Figure 7:
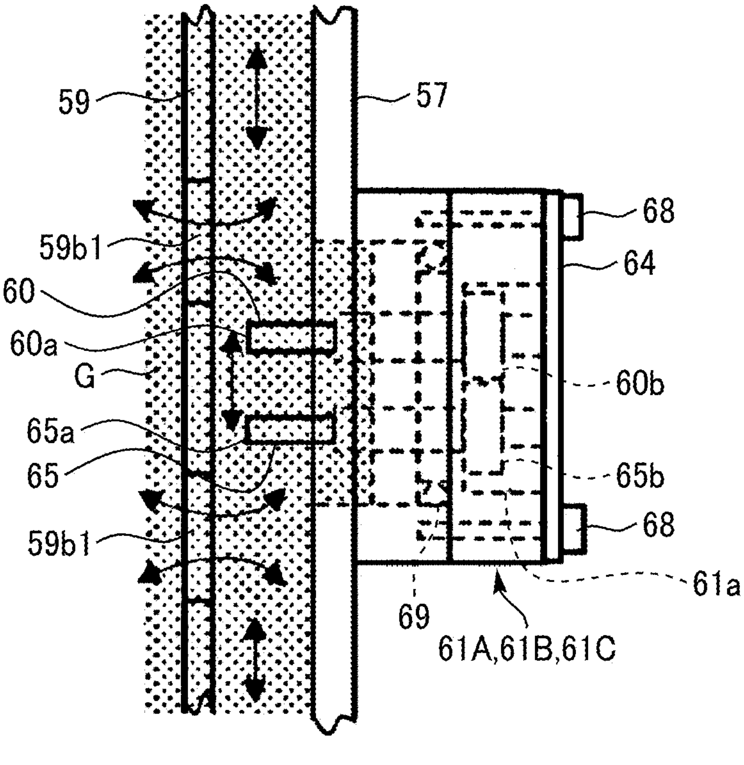
FIG. 7 is an enlarged view of the vicinity of a temperature sensor.

Here, referring to FIGS. 4, 5, 7, and the like, the coating device 50 (coating device main part 51) in the present embodiment is provided with the temperature sensor 60 that detects a temperature of the coating liquid G stored in the storage 57, and a heater 58 as a heating unit that heats the coating liquid G stored in the storage 57 based on the temperature detected by the temperature sensor 60.

Note that, in the present embodiment, as the temperature sensor 60, a substantially rod-shaped liquid temperature sensor installed so as to stand in a horizontal direction from a side portion to a central portion in the storage 57 is used. Furthermore, in the present embodiment, the heater 58 that heats the bottom portion of the storage 57 to indirectly heat the coating liquid G is used, but a heater that directly heats the coating liquid G in the storage 57 can also be used.

In the present embodiment, the temperature sensors 60 are disposed at different positions in the longitudinal direction (that is a direction perpendicular to the plane on which FIG. 4 is drawn and is a left-right direction of FIG. 5). Specifically, in the present embodiment, three temperature sensors 60 are installed at a center position in the longitudinal direction and positions on both sides equally spaced apart from the center position inside the storage 57.

As described above, the heater 58 is controlled by the controller 70 based on the detection results of the temperature sensors 60 installed in the longitudinal direction to adjust the temperature of the coating liquid G in the storage 57, whereby the coating amount of the coating liquid to the sheet P (object to be applied) is stabilized. Therefore, it is possible to reliably prevents the occurrence of blurring and show-through in an image formed on the sheet P by the image forming device 1.

Specifically, the viscosity of the coating liquid G stored in the storage 57 changes with the temperature change. When the viscosity of the coating liquid G changes, an amount (pumping amount) of the coating liquid G pumped up by the pumping roller 55 also changes, and the amount of the coating liquid finally applied to the sheet P by the coating roller 52 also becomes unstable. Specifically, when the viscosity of the coating liquid G increases, the pumping amount by the pumping roller 55 increases and the coating amount of the coating liquid by the coating roller 52 also increases as compared with the case where the viscosity is low.

Therefore, in order to stabilize the coating amount of the coating liquid by the coating roller 52, it is necessary to accurately detect the temperature of the coating liquid G in the storage 57 and accurately adjust the temperature of the coating liquid G to a target temperature based on a result of the detection. However, since the temperature of the coating liquid G stored in the storage 57 is not constant depending on a position in the longitudinal direction, even if the temperature of the coating liquid G is detected by one temperature sensor, the entire temperature of the coating liquid G cannot be grasped. That is, even if the temperature of the coating liquid G is detected by one temperature sensor and the heater 58 is controlled on the basis of the detected temperature, the viscosity of the coating liquid G is not intended as a whole, and the coating amount of the coating liquid by the coating roller 52 becomes unstable.

On the other hand, in the present embodiment, the plurality of temperature sensors 60 is installed in the longitudinal direction, the temperature of the coating liquid G at different positions in the longitudinal direction is detected, and the temperature of the coating liquid G is adjusted (viscosity is adjusted) based on results of the detection, so that such a situation is less likely to occur.

More specifically, in the present embodiment, the heater 58 (heating unit) is controlled by the controller 70 to heat the coating liquid G stored in the storage 57 based on an average value of the temperatures detected by the plurality of temperature sensors 60.

Figure 8:
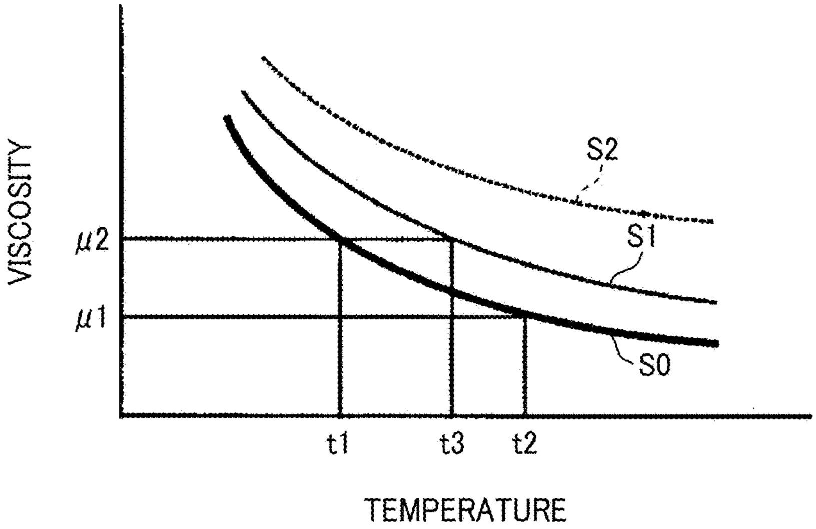
FIG. 8 is a graph illustrating a relationship between a temperature and a viscosity in a coating liquid.

Specifically, the heater 58 (heating unit) is on/off controlled such that the average value of the temperatures detected by the three temperature sensors 60 falls within a predetermined range (that is a range from t1 to t2 in FIG. 8, and is, for example, 25° C.±5° C.). That is, the heater 58 is turned on when the average value of the temperatures falls below the predetermined range, and the heater 58 is turned off when the average value of the temperatures exceeds the predetermined range. Note that the "predetermined range" is a temperature of the coating liquid G set so that the amount of the coating liquid G applied to the sheet P by the coating roller 52 becomes a target value.

Here, referring to FIGS. 4, 5, 7, and the like, the coating device 50 in the present embodiment is provided with the viscosity sensor 65 that detects the viscosity of the coating liquid G stored in the storage 57.

Note that, as the viscosity sensor 65, a known sensor can be used. In the present embodiment, as the viscosity sensor 65, a substantially rod-shaped sensor installed so as to stand in the horizontal direction from the side portion to the central portion in the storage 57 is used.

At least one of the heater 58 (heating unit) and the water supply units 78, 83, and 111 (see FIG. 3) is driven and controlled based on detection results of the temperature sensor 60 and the viscosity sensor 65.

Specifically, as described above, heating by the heater 58 (heating unit) is performed so that the temperature detected by the temperature sensors is within a predetermined range (within the range of temperatures t1 to t2 in FIG. 8).

In a case where the viscosity detected by the viscosity sensor 65 is not within the predetermined range (within a range of viscosity μ1 to μ2 in FIG. 8), heating by the heater 58 is performed within the predetermined range (of temperatures t1 to t2), and in a case where the viscosity detected by the viscosity sensor 65 is not within a predetermined range (of viscosity μ1 to μ2) even if the heating is performed, water is supplied by the water supply units 78, 83, and 111 (drive control of the pump 111).

As illustrated in FIG. 8, the coating liquid G has a property that the viscosity decreases as the temperature increases and the viscosity increases as the temperature decreases.

As illustrated in a graph S0, the viscosity of the new coating liquid G changes between μ1 and μ2 (predetermined range) in a case where the temperature is in the range of t1 to t2 (predetermined range) that is a printing application range.

However, as illustrated in a graph S1, when moisture of the coating liquid G stored in the recycle storage 76 (see FIG. 3) evaporates due to an environment or time in which the coating liquid G is left, the viscosity of the coating liquid G may deviate from an appropriate range (predetermined range of μ1 to μ2). In such a case, by heating the coating liquid G by the heater 58 based on the detection result of the viscosity sensor 65, the viscosity can be returned to an appropriate range (predetermined range of μ1 to μ2). For example, in the graph S1, by increasing the temperature of the coating liquid G from t1 to t3, the viscosity of the coating liquid G can be reduced to μ2 that is an appropriate value.

However, when a large amount of moisture evaporates in the coating liquid G in the storage 57, the viscosity of the coating liquid G becomes very large as illustrated in the graph S2. In such a case, even if the coating liquid G is heated by the heater 58, the viscosity of the coating liquid G does not fall within an appropriate range (predetermined range of μ1 to μ2). Therefore, in such a case, pure water is supplied from the pure water tank 78 (see FIG. 3) into the storage 57 so that the viscosity falls within an appropriate range (predetermined range of μ1 to μ2). In this case, the temperature and viscosity are optimized by heating the coating liquid G by the heater 58 as necessary.

As described above, in the present embodiment, driving of the heater 58 and the motor 111 (water supply units 78, 83, and 111) is controlled based on detection results of the temperature sensor 60 and the viscosity sensor 65.

Therefore, even if the viscosity of the coating liquid G is about to change beyond the target range, the viscosity of the coating liquid G is easily maintained (easily returned) within the target range. Therefore, the coating amount of the coating liquid G to the sheet P is also sufficiently stabilized.

Here, when water is supplied to the storage 57 by the water supply units 78, 83, and 111, the coating device 50 according to the present embodiment performs control such that the pumping operation by the pumping roller 55 (pumper) is performed for a certain period of time.

Specifically, when the motor 111 for water supply is driven, the pumping roller 55 is rotationally driven for a certain period of time.

As described above, by performing the pumping operation by the pumping roller 55 during the water supply to the storage 57, the temperature and viscosity of the coating liquid G in the storage 57 are made uniform, so that the effect of stabilizing the coating amount by the water supply described above is easily efficiently exhibited.

Furthermore, referring to FIGS. 3 to 5 and the like, in the coating device 50 according to the present embodiment, the water supply units 78, 83, and 111 are constituted to supply water from the bottom portion of the storage 57 (below a straightening plate 59 described later). To be more specific, the water supply pipe 83 (water supply port) is connected to the bottom portion of the storage 57.

With such a configuration, the moisture supplied to the coating liquid G in the storage 57 is appropriately stirred and mixed by the straightening plate 59, so that a rapid change in the temperature or viscosity of the coating liquid G is prevented. Therefore, the effect of stabilizing the coating amount by water supply is easily efficiently exhibited.

Here, referring to FIGS. 5, 7, and the like, the temperature sensor 60 and the viscosity sensor 65 are installed at positions close to each other.

Specifically, the temperature sensor 60 and the viscosity sensor 65 are held at positions close to each other as a unit (set) by three plug members 61A, 61B, and 61C to be described later.

With such a configuration, the temperature and the viscosity of the coating liquid G correlated with each other are accurately detected by the temperature sensor 60 and the viscosity sensor 65 disposed close to each other.

In particular, a plurality of sets (three sets) of the temperature sensor 60 and the viscosity sensor 65 is provided at intervals in the longitudinal direction (the direction in which the pumping roller 55 as a pumper extends).

Since the viscosity of the coating liquid G stored in the storage 57 is not constant depending on the position in the longitudinal direction, even if the viscosity of the coating liquid G is detected by one viscosity sensor, the viscosity of the entire coating liquid G cannot be grasped. That is, even if the viscosity of the coating liquid G is detected by one viscosity sensor and the heater 58 and the motor 111 (water supply unit) are controlled on the basis of the detected viscosity, the viscosity of the coating liquid G is not intended as a whole, and the amount of the coating liquid by the coating roller 52 becomes unstable.

On the other hand, in the present embodiment, a plurality of the viscosity sensors 65 is installed in the longitudinal direction together with the temperature sensors 60, the viscosity and the temperature of the coating liquid G at different positions in the longitudinal direction are detected, and the temperature (viscosity) of the coating liquid G is adjusted based on the detection results, so as to avoid such a situation.

Specifically, the heater 58 and the motor 111 (water supply unit) are controlled based on the respective average values of the viscosity and the temperatures detected by the three viscosity sensors 65 and temperature sensors 60.

Referring to FIGS. 4 to 7, in the coating device 50 according to the present embodiment, the straightening plate 59 is disposed between the pumping roller 55 (pumper) and the bottom portion of the storage 57.

Figure 6:
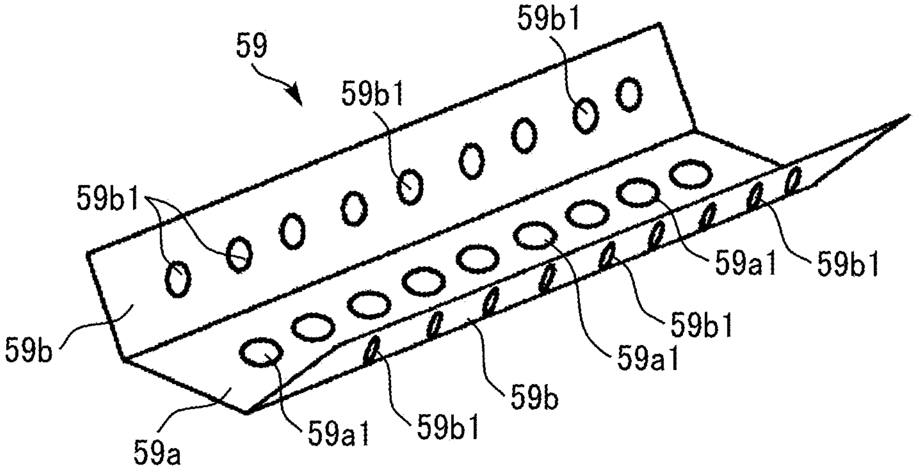
FIG. 6 is a perspective view of a straightening plate.

The straightening plate 59 has a surface portion (side surface portion 59*b*) facing a side wall of the storage 57, and a plurality of holes 59*al* and 59*b*1 is formed. Specifically, as illustrated in FIG. 6, the straightening plate 59 is formed such that the side surface portions 59*b* are inclined upward toward the outside at both end portions in the lateral direction with respect to a bottom surface portion 59*a*. The plurality of holes 59*a*1 is formed in the bottom surface portion 59*a* at equal intervals in the longitudinal direction, and the plurality of holes 59*b*1 is also formed in the side surface portion 59*b* at equal intervals in the longitudinal direction.

By providing the straightening plate 59 constituted as described above, when the pumping roller 55 is rotated or stopped rotating, the coating liquid G in the storage 57 appropriately moves in the vertical direction and the horizontal direction through the holes 59*a*1 and 59*b*1 of the straightening plate 59 as indicated by double-headed arrows in FIG. 7, and the coating liquid G uniformly spreads in the storage 57 without being locally biased. Therefore, the effect of providing the plurality of temperature sensors 60 and the plurality of viscosity sensors 65 described above is further exhibited.

As illustrated in FIG. 7 and the like, the temperature sensor 60 and the viscosity sensor 65 are disposed at positions facing the side surface portion 59*b* (surface portion) of the straightening plate 59.

As described above, by disposing the temperature sensor 60 and the viscosity sensor 65 in the vicinity of the hole 59*b*1 (straightening plate 59), it is possible to detect the temperature and the viscosity of the coating liquid G actively flowing in the hole 59*b*1, and thus, it is possible to reduce erroneous detection of the temperature and the viscosity.

In particular, in the present embodiment, as illustrated in FIG. 7, each of the plurality of temperature sensors 60 is installed on a side portion of the storage 57, and a detection portion 60*a* (that is an element portion mainly performing temperature detection) is installed so as to protrude toward the hole 59*b*1.

Similarly, each of the plurality of viscosity sensors 65 is also installed on the side portion of the storage 57, and a detection portion 65*a* (that is an element portion mainly performing viscosity detection) is installed so as to protrude toward the hole 59*b*1.

As a result, even when the rotation of the pumping roller 55 is stopped and the flow of the coating liquid G is reduced as compared with the time of rotation, the temperature and viscosity of the coating liquid G can be accurately detected.

Here, with reference to FIGS. 4, 5, 7, and the like, the plurality of plug members 61A, 61B, and 61C is detachably installed in a plurality of openings formed in the side portion of the storage 57, respectively.

Specifically, the plug members 61A, 61B, and 61C have a shape in which columns having different outer diameters are stacked in a step shape and are installed so as to be fitted into the openings on the side portion of the storage 57.

Furthermore, a groove is formed at a boundary between a small diameter portion and a large diameter portion of the plug members 61A, 61B, and 61C, and a packing 69 such as an O-ring is installed in the groove. As a result, gaps between the plug members 61A, 61B, and 61C and the openings of the storage 57 are sealed, and the coating liquid G is prevented from leaking from the gaps.

As illustrated in FIG. 5, the plurality of temperature sensors 60 and the plurality of viscosity sensors 65 are respectively installed in all of the plurality of plug members 61A, 61B, and 61C.

Specifically, as illustrated in FIG. 7, the temperature sensor 60 and the viscosity sensor 65 are installed so as to be fitted into two through holes formed in each of the plug members 61A, 61B, and 61C.

Then, positions in the left-right direction of the temperature sensor 60 and the viscosity sensor 65 in the plug members 61A, 61B, and 61C are determined at positions where flanges 60*b* and 65*b* formed at center portions in the longitudinal direction of the temperature sensor 60 and the viscosity sensor 65 abut on counterbores 61*a* formed in the plug members 61A, 61B, and 61C. Moreover, a lid member 64 is installed through a sealing material so as to cover the counterbores 61*a* of the plug members 61A, 61B, and 61C in a state where the temperature sensors 60 and the viscosity sensors 65 are installed, thereby preventing the temperature sensors 60 from falling off. The lid member 64 is fixed to the storage 57 together with the plug members 61A, 61B, and 61C by screwing a screw 68 into a female screw portion of a cylindrical portion in which an opening is formed via screw holes formed in both members.

Note that when the coating liquid G is removed from the storage 57 or when maintenance of the temperature sensor 60 and the viscosity sensor 65 is performed, the screw 68 is removed, and the plug members 61A, 61B, and 61C are removed from the storage 57 together with the temperature sensor 60 and the viscosity sensor 65.

As described above, by installing the temperature sensors 60 and the viscosity sensors 65 in the plug members 61A, 61B, and 61C, the positions in the longitudinal direction, the lateral direction, and the vertical direction of the temperature sensors 60 and the viscosity sensors 65 in the storage 57 can be determined with high accuracy, so that the effect of providing the plurality of temperature sensors 60 and the plurality of viscosity sensors 65 described above is further exhibited.

Hereinafter, an example of temperature/viscosity control performed by the coating device 50 (image forming system 100) according to the present embodiment will be described with reference to a flowchart of FIG. 9.

Figure 9:
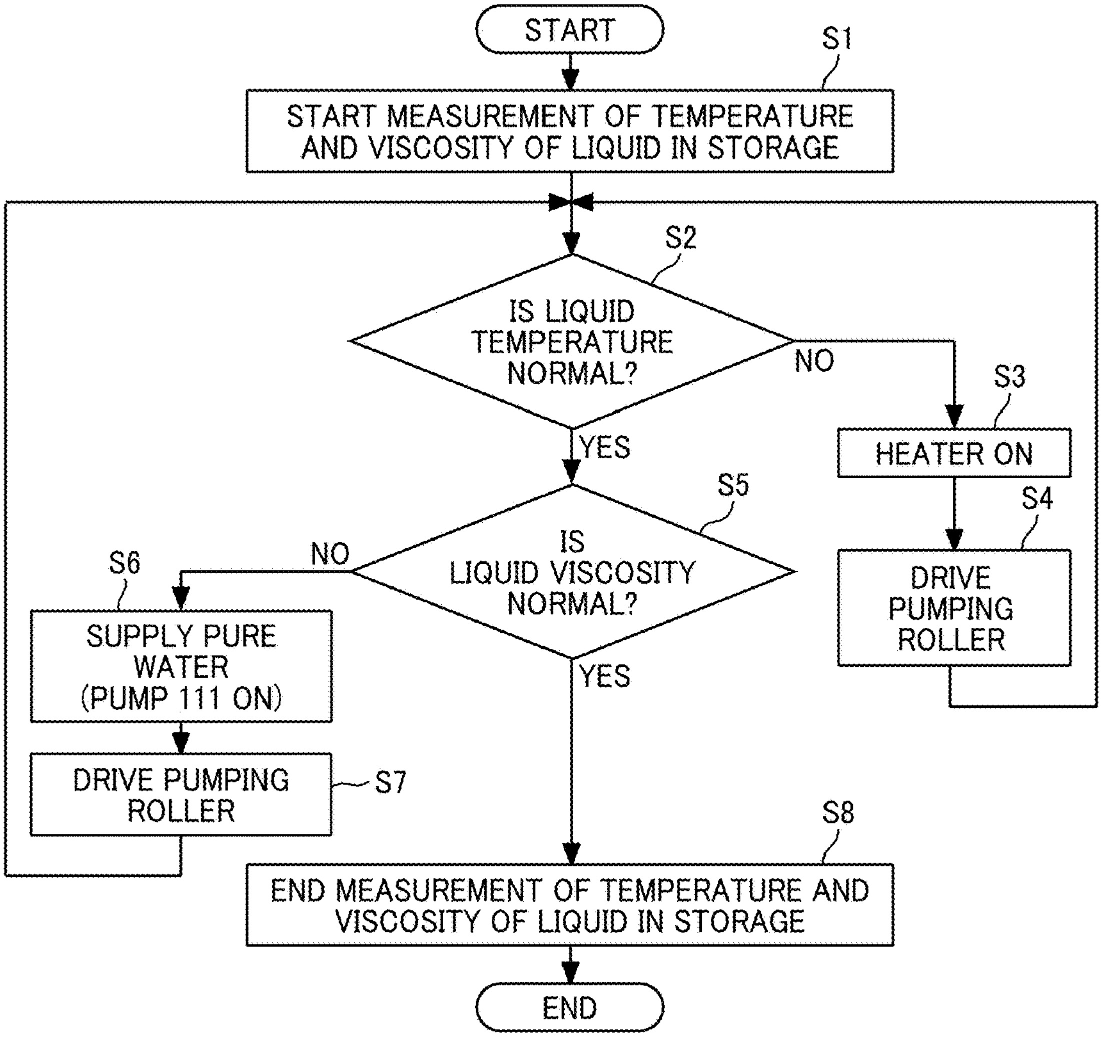
FIG. 9 is a flowchart illustrating a control performed by a coating device.

As illustrated in FIG. 9, when a printing preparation operation (warm-up operation) is started in the image forming system 100, as described above, in a case where the coating liquid G is stored in the recycle storage 76, the pump 110 (see FIG. 3) is operated to supply the coating liquid G in the recycle storage 76 to the storage 57 via the recycle pipe 102, the filter case 79, and the supply pipe 62 by switching the three-way valve 115. Then, when the storage 57 is filled with the predetermined coating liquid G, the temperature and viscosity measurements of the coating liquid G are started (step S1). That is, the control flow for measuring the temperature and viscosity of the coating liquid G in the storage 57 is started.

First, it is determined whether the average temperature of the coating liquid G detected by the plurality of temperature sensors 60 installed in the storage 57 is an appropriate temperature (within the range of temperatures t1 to t2) (step S2).

In a case where it is determined in step S2 that the temperature of the coating liquid G is not appropriate (in a case where the temperature is lower than the temperature t1 in the appropriate range), the heater 58 is turned on (step S3) to heat the coating liquid G in the storage 57. After the heater 58 is turned on, the pumping roller 55 is driven for a predetermined period of time every predetermined time (step S4), and the coating liquid G in the storage 57 is stirred to make the temperature of the coating liquid G uniform. Then, such an operation is repeated until it is determined in step S2 that the temperature of the coating liquid G is appropriate.

When it is determined in step S2 that the temperature of the coating liquid G is appropriate, next, it is determined whether the viscosity of the coating liquid G in the storage 57 is appropriate (within a range of viscosity μ1 to μ2) by the plurality of viscosity sensors 65 installed in the storage 57 (step S5).

Then, when it is determined in step S5 that the viscosity of the coating liquid G is not appropriate (in a case where the viscosity is higher than the viscosity μ2 in the appropriate range), the pump 111 (see FIG. 3) is operated to supply water in the pure water tank 78 to the storage 57 via the water supply pipe 87 (step S6). When the water is supplied to the storage 57, the pumping roller 55 is driven for a predetermined period of time (step S7), and the coating liquid G in the storage 57 is stirred to make the viscosity of the coating liquid G in the storage 57 uniform.

Then, the flow after step S2 is repeated, and in a case where it is determined in step S5 that the viscosity of the coating liquid G is appropriate, this flow is ended (step S8). That is, the control flow of measuring the temperature and the viscosity (storage liquid temperature, liquid viscosity) of the coating liquid G in the storage 57 is ended, and the printing preparation operation is completed.

Note that the coating liquid G (pretreatment liquid) used in the coating device 50 (image forming system 100) in the present embodiment affects the coating amount when the viscosity changes, and particularly when the coating liquid is left standing, moisture evaporates and the coating liquid and thickens. Therefore, the viscosity is adjusted to fall within an appropriate range as described above.

As the coating liquid G having such characteristics, a coating liquid containing a coagulant, an organic solvent, and water, and a coating liquid obtained by selecting and mixing one or more of a surfactant, an antifoaming agent, a pH adjusting agent, an antiseptic and antifungal agent, a rust inhibitor, and the like as necessary can be used. Furthermore, the coating liquid G may be applied to an entire region of the sheet P or may be applied only to a region where the ink image is formed.

Organic Solvent

The organic solvent is not particularly limited and water-soluble organic solvents can be used. Examples thereof include polyhydric alcohols, ethers such as polyhydric alcohol alkyl ethers and polyhydric alcohol aryl ethers, nitrogen-containing heterocyclic compounds, amides, amines, and sulfur-containing compounds.

Specific examples of the water-soluble organic solvent include: polyhydric alcohols such as ethylene glycol, diethylene glycol, 1,2-propanediol, 1,3-propanediol, 1,2-butanediol, 1,3-butanediol, 1,4-butanediol, 2,3-butanediol, 3-methyl-1,3-butanediol, triethylene glycol, polyethylene glycol, polypropylene glycol, 1,2-pentanediol, 1,3-pentanediol, 1,4-pentanediol, 2,4-pentanediol, 1,5-pentanediol, 1,2-hexanediol, 1,6-hexanediol, 1,3-hexanediol, 2,5-hexanediol, 1,5-hexanediol, glycerin, 1,2,6-hexanetriol, 2-ethyl-1,3-hexanediol, ethyl-1,2,4-butanetriol, 1,2,3-butanetriol, 2,2,4-trimethyl-1,3-pentanediol, and petriol; polyhydric alcohol alkyl ethers such as ethylene glycol monoethyl ether, ethylene glycol monobutyl ether, diethylene glycol monomethyl ether, diethylene glycol monoethyl ether, diethylene glycol monobutyl ether, tetraethylene glycol monomethyl ether, and propylene glycol monoethyl ether; polyhydric alcohol aryl ethers such as ethylene glycol monophenyl ether and ethylene glycol monobenzyl ether; nitrogen-containing heterocyclic compounds such as 2-pyrrolidone, N-methyl-2-pyrrolidone, N-hydroxyethyl-2-pyrrolidone, 1,3-dimethyl-2-imidazolidinone, ε-caprolactam, and γ-butyrolactone; amides such as formamide, N-methylformamide, N,N-dimethylformamide, 3-methoxy-N,N-dimethylpropionamide; 3-butoxy-N,N-dimethylpropionamide; amines such as monoethanolamine, diethanolamine, and triethylamine; sulfur-containing compounds such as dimethylsulfoxide, sulfolane, and thiodiethanol; propylene carbonate; and ethylene carbonate.

In particular, organic solvents having a boiling point of 250° C. or less are preferred, since they not only function as a wetting agent but also provide good drying property.

Polyol compounds having 8 or more carbon atoms and glycol ether compounds are also preferred. Specific examples of the polyol compounds having 8 or more carbon atoms include 2-ethyl-1,3-hexanediol and 2,2,4-trimethyl-1,3-pentanediol.

Specific examples of the glycol ether compounds include: polyhydric alcohol alkyl ethers such as ethylene glycol monoethyl ether, ethylene glycol monobutyl ether, diethylene glycol monomethyl ether, diethylene glycol monoethyl ether, diethylene glycol monobutyl ether, tetraethylene glycol monomethyl ether, and propylene glycol monoethyl ether; and polyhydric alcohol aryl ethers such as ethylene glycol monophenyl ether and ethylene glycol monobenzyl ether.

The polyol compound having 8 or more carbon atoms and the glycol ether compound can improve the ink permeability in a case where paper is used as the sheet P.

Surfactant

Usable surfactants include silicone-based surfactants, fluorine-based surfactants, amphoteric surfactants, nonionic surfactants, and anionic surfactants.

The silicone-based surfactants are not particularly limited and can be suitably selected to suit to a particular application.

Preferred are silicone-based surfactants which are not decomposed even in a high pH environment. Specific examples thereof include side-chain-modified polydimethylsiloxane, both-end-modified polydimethylsiloxane, one-end-modified polydimethylsiloxane, and side-chain-both-end-modified polydimethylsiloxane. In particular, those having a polyoxyethylene group and/or a polyoxyethylene polyoxypropylene group as the modifying group are preferable because they demonstrate good characteristics as an aqueous surfactant. Furthermore, specific examples of the silicone-based surfactants further include polyether-modified silicone-based surfactants, such as a dimethyl siloxane compound having a polyalkylene oxide structure on a side chain which is bound to Si.

Specific preferred examples of the fluorine-based surfactants include perfluoroalkyl sulfonic acid compounds, perfluoroalkyl carboxylic acid compounds, perfluoroalkyl phosphate compounds, perfluoroalkyl ethylene oxide adducts, and polyoxyalkylene ether polymer compounds having a perfluoroalkyl ether group on a side chain, each of which has weak foaming property. Specific examples of the perfluoroalkyl sulfonic acid compounds include perfluoroalkyl sulfonic acid and perfluoroalkyl sulfonate. Specific examples of the perfluoroalkyl carboxylic acid compounds include perfluoroalkyl carboxylic acid and perfluoroalkyl carboxylate. Specific examples of the polyoxyalkylene ether polymer compounds having a perfluoroalkyl ether group on a side chain include a sulfate of a polyoxyalkylene ether polymer having a perfluoroalkyl ether group on its side chain, and a salt of a polyoxyalkylene ether polymer having a perfluoroalkyl ether group on its side chain. Specific examples of the counter ions for these fluorine-based surfactants include Li, Na, K, $NH_4$, $NH_3CH_2CH_2OH$, $NH_2(CH_2CH_2OH)_2$, and $NH(CH_2CH_2OH)_3$.

Specific examples of the amphoteric surfactants include laurylaminopropionate, lauryl dimethyl betaine, stearyl dimethyl betaine, and lauryl hydroxyethyl betaine.

Specific examples of the nonionic surfactants include polyoxyethylene alkyl phenyl ethers, polyoxyethylene alkyl esters, polyoxyethylene alkylamines, polyoxyethylene alkylamides, polyoxyethylene propylene block polymers, sorbitan fatty acid esters, polyoxyethylene sorbitan fatty acid esters, and ethylene oxide adducts of acetylene alcohol.

Specific examples of the anionic surfactants include polyoxyethylene alkyl ether acetate, dodecylbenzene sulfonate, lauryl salt, and polyoxyethylene alkyl ether sulfate salts.

Each of these can be used alone or in combination with others.

The silicone-based surfactants are not particularly limited and can be suitably selected to suit to a particular application. Specific examples thereof include side-chain-modified polydimethylsiloxane, both-end-modified polydimethylsiloxane, one-end-modified polydimethylsiloxane, and side-chain-and-both-end-modified polydimethylsiloxane. More specifically, polyether-modified silicone-based surfactants having polyoxyethylene group and/or polyoxyethylene polyoxypropylene group as the modifying groups are preferable since they exhibit good properties as an aqueous surfactant.

These surfactants may be either synthesized products or commercially available products. Commercial products are readily available from, for example, BYK Japan KK, Shin-Etsu Chemical Co., Ltd., Dow Corning Toray Co., Ltd., Nihon Emulsion Co., Ltd., and Kyoeisha Chemical Co., Ltd.

The polyether-modified silicone-based surfactants are not particularly limited and can be suitably selected to suit to a particular application. Specific examples thereof include, but are not limited to, a compound represented by the following General Formula (S-1) that is a dimethylpolysiloxane having a polyalkylene oxide structure on a side chain which is bound to Si.

General Formula (S-1)

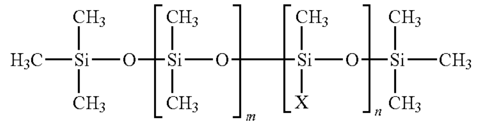

$X= -R(C_2H_4O)_a(C_3H_6O)_b R'$ (In General Formula (S-1), m, n, a, and b represent integers. R and R' each represent an alkyl group or an alkylene group.)

Specific examples of commercially available products of the polyether-modified silicone-based surfactants include: KF-618, KF-642, and KF-643 (products of Shin-Etsu Chemical Co., Ltd.); EMALEX-SS-5602 and SS-1906EX (products of Nihon Emulsion Co., Ltd.); FZ-2105, FZ-2118, FZ-2154, FZ-2161, FZ-2162, FZ-2163, and FZ-2164 (products of Dow Corning Toray Silicone Co., Ltd.); BYK-33 and BYK-387 (products of BYK-Chemie GmbH); and TSF4440, TSF4452, and TSF4453 (products of Momentive Performance Materials Inc.).

Preferably, the fluorine-based surfactant is a compound having 2 to 16 fluorine-substituted carbon atoms, more preferably a compound having 4 to 16 fluorine-substituted carbon atoms.

Specific examples of the fluorine-based surfactants include perfluoroalkyl phosphate compounds, perfluoroalkyl ethylene oxide adducts, and polyoxyalkylene ether polymer compounds having a perfluoroalkyl ether group on its side chain. Among these, polyoxyalkylene ether polymer compounds having a perfluoroalkyl ether group on a side chain are preferred for their small foaming property. More specifically, compounds represented by the following General Formula (F-1) or (F-2) are preferred as the fluorine-based surfactants.

General Formula (F-1)

$$CF_3CF_2(CF_2CF_2)_m-CH_2CH_2O(CH_2CH_2O)_nH$$

In the General Formula (F-1), preferably, m is an integer of from 0 to 10 and n is an integer of from 0 to 40, for imparting water-solubility to the compound.

$$C_nF_{2n+1}-CH_2CH(OH)CH_2-O-(CH_2CH_2O)_a-Y$$ General Formula (F-2)

In the compound represented by the above General Formula (F-2), Y is H, or n is an integer of 1 to 6 in $CnF_{2n+1}$, or n is an integer of 4 to 6 in $CH_2CH(OH)CH_2$-$CnF_{2n+1}$, or p is an integer of 1 to 19 in $CpH_{2p+1}$. a is an integer of 4 to 14.

The fluorine-based surfactants may be commercially available products. Examples of the commercially available product include: SURFLON S-111, S-112, S-113, S-121, S-131, S-132, S-141, and S-145 (All of which are manufactured by Asahi Glass Co., Ltd.); Fullard FC-93, FC-95, FC-98, FC-129, FC-135, FC-170C, FC-430, and FC-431 (All of which are manufactured by Sumitomo 3M Limited); Megafac F-470, F-1405, F-474 (All of which are manufactured by Dainippon Ink and Chemicals, Inc.); Zonyl TBS, FSP, FSA, FSN-100, FSN, FSO-100, FSO, FS-300, and UR (All of which are manufactured by DuPont); FT-110, FT-250, FT-251, FT-400S, FT-150, and FT-400SW (All of which are manufactured by NEOS CORPORATION); POLYFOX PF-136A, PF-156A, PF-151N, PF-154, and PF-159 (manufactured by OMNOBA CORPORATION); and UNIDYNE DSN-403N (manufactured by DAIKIN INDUSTRIES, LTD.), and among these, FS-300 manufactured by DuPont, FT-110, FT-250, FT-251, FT-400S, FT-150, and FT-400SW manufactured by NEOS CORPORATION, POLYFOX PF-151N manufactured by OMNOBA CORPORATION, and UNIDYNE DSN-403N manufactured by DAIKIN INDUSTRIES, LTD. are particularly preferable from the viewpoint of remarkably improving good printing quality, in particular color developability, and permeability, wettability, and leveling property.

Antifoaming Agent

Specific examples of the antifoaming agent include silicone-based defoamers, polyether-based defoamers, and fatty-acid-ester-based defoamers. Each of these can be used alone or in combination with others. Among these defoamers, silicone-based defoamers are preferred for their excellent defoaming ability.

pH Adjusting Agent

The pH adjusting agent is not particularly limited as long as it is capable of adjusting the pH to 7 or higher. Specific examples thereof include amines such as diethanolamine and triethanolamine.

Antiseptic and Antifungal Agent

Specific examples of the antiseptic and antifungal agent include 1,2-benzisothiazoline-3-one.

Rust Inhibitor

Specific examples of the rust inhibitor include acid sulphite and sodium thiosulfate.

As described above, the coating device 50 (image forming system 100) according to the present embodiment includes the storage 57 that stores the coating liquid G, the pumping roller 55 (pumper) that pumps up the coating liquid G stored in the storage 57, the temperature sensor 60 that detects the temperature of the coating liquid G stored in the storage 57, the viscosity sensor 65 that detects the viscosity of the coating liquid G stored in the storage 57, the heater 58 (heating unit) that heats the coating liquid G stored in the storage 57, and the water supply units 78, 83, and 111 that supply water to the storage 57. At least one of the heater 58 and the water supply units 78, 83, and 111 is driven and controlled based on detection results of the temperature sensor 60 and the viscosity sensor 65.

As a result, the coating amount of the coating liquid G to the sheet P (object to be applied) is stabilized.

Note that, in the present embodiment, the three temperature sensors 60 and viscosity sensors 65 are installed in the coating device 50, but the number of the temperature sensors and the viscosity sensors 65 is not limited thereto, and two or less or four or more temperature sensors and viscosity sensors 65 may be installed.

Furthermore, the present embodiment is applied to the coating device 50 as a pretreatment device of the inkjet printer 1, but the application of the present embodiment is not limited thereto, and the present embodiment can be applied to all coating devices as long as the coating device stores a coating liquid whose viscosity changes due to temperature change.

Even in such cases, an effect similar to that of the present embodiment can be obtained.

Note that the present invention is not limited to the present embodiments, and it is apparent that the present embodiments can be appropriately modified within the scope of the technical idea of the present invention in addition to what is suggested in the present embodiments. Furthermore, the number, position, shape, and so forth of the constituent members are not limited to the present embodiments, and may be the number, position, shape, and so forth that are suitable for implementing the present invention.

Note that an aspect of the present invention may be, for example, a combination of first to eighth aspects as follows.

First Aspect

According to a first aspect, a coating device includes: a storage in which a coating liquid is stored; a pumper that pumps up the coating liquid stored in the storage; a temperature sensor that detects a temperature of the coating liquid stored in the storage; a viscosity sensor that detects a viscosity of the coating liquid stored in the storage; a heating unit that heats the coating liquid stored in the storage; a water supply unit that supplies water to the storage; and circuitry configured to control at least one of the heating unit or the water supply unit based on detection results of the temperature sensor and the viscosity sensor.

Second Aspect

According to a second aspect, in the coating device of the first aspect, the circuitry controls: the heating unit to heat the coating liquid so that the temperature detected by the temperature sensor falls within a predetermined temperature range; the heating unit to heat the coating liquid within the predetermined temperature range, when the viscosity detected by the viscosity sensor does not fall within a predetermined viscosity range; and the water supply unit to supply water, when the viscosity detected by the viscosity sensor does not fall within the predetermined viscosity range even when the heating unit heats the coating liquid.

Third Aspect

According to a third aspect, the coating device of the first aspect or the second aspect further includes: a coating liquid supply unit that supplies the coating liquid to the storage; a coating liquid discharge unit that discharges the coating liquid from the storage; a coating liquid recycle supply unit including a recycle storage, the coating liquid recycle supply unit supplying to the storage again the coating liquid discharged by the coating liquid discharge unit and stored in the recycle storage; and a waste liquid discard unit including a waste liquid tank, the waste liquid discard unit discarding the coating liquid stored in the recycle storage toward the waste liquid tank, in which the circuitry controls: the coating liquid recycle supply unit to supply the coating liquid, when the coating liquid is being applied to an object and a predetermined time has not elapsed since the coating liquid has been stored in the recycle storage; and the coating liquid recycle supply unit to supply the coating liquid and the waste liquid discard unit to discard the coating liquid, when the coating liquid is being applied to an object and the predetermined time has elapsed since the coating liquid has been stored in the recycle storage.

Fourth Aspect

According to a fourth aspect, in the coating device of any one of the first to third aspects, the circuitry controls, when the water supply unit supplies water, the pumper to pump up the coating liquid for a certain period of time.

Fifth Aspect

According to a fifth aspect, the coating device of any one of the first to fourth aspects further includes: a straightening plate between the pumper and a bottom portion of the storage, the straightening plate including a surface portion facing a side wall of the storage and having a plurality of holes, in which the temperature sensor and the viscosity sensor are disposed facing the surface portion of the straightening plate.

Sixth Aspect

According to a sixth aspect, in the coating device of the fifth aspect, the water supply unit supplies water from the bottom portion of the storage.

Seventh Aspect

According to a seventh aspect, in the coating device of any one of the first to sixth aspects, the temperature sensor and the viscosity sensor are disposed close to each other, and a plurality of sets of the temperature sensor and the viscosity sensor are disposed at intervals in a longitudinal direction in which the pumper extends.

Eighth Aspect

According to an eighth aspect, an image forming system includes: the coating device of any one of the first to seventh aspects; and an image forming device.

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present invention. Any one of the above-described operations may be performed in various other ways, for example, in an order different from the one described above.

The functionality of the elements disclosed herein may be implemented using circuitry or processing circuitry which includes general purpose processors, special purpose processors, integrated circuits, application-specific integrated circuits (ASICs), field-programmable gate arrays (FPGAs), and/or combinations thereof which are configured or programmed, using one or more programs stored in one or more memories, to perform the disclosed functionality. Processors are considered processing circuitry or circuitry as they include transistors and other circuitry therein. In the disclosure, the circuitry, units, or means are hardware that carry out or are programmed to perform the recited functionality. The hardware may be any hardware disclosed herein which is programmed or configured to carry out the recited functionality.

The invention claimed is:

1. A coating device comprising:

a storage that stores a coating liquid;

a pumper that pumps up the coating liquid stored in the storage;

a temperature sensor that detects a temperature of the coating liquid stored in the storage;

a viscosity sensor that detects a viscosity of the coating liquid stored in the storage;

a heating unit that heats the coating liquid stored in the storage;

a water supply unit that supplies water to the storage; and circuitry configured to control at least one of the heating unit or the water supply unit based on detection results of the temperature sensor and the viscosity sensor.

2. The coating device according to claim 1, wherein the circuitry controls:

the heating unit to heat the coating liquid so that the temperature detected by the temperature sensor falls within a predetermined temperature range;

the heating unit to heat the coating liquid within the predetermined temperature range, when the viscosity detected by the viscosity sensor does not fall within a predetermined viscosity range; and the water supply unit to supply water, when the viscosity detected by the viscosity sensor does not fall within the predetermined viscosity range even when the heating unit heats the coating liquid.

3. The coating device according to claim 1, further comprising:

a coating liquid supply unit that supplies the coating liquid to the storage;

a coating liquid discharge unit that discharges the coating liquid from the storage;

a coating liquid recycle supply unit including a recycle storage, the coating liquid recycle supply unit supplying to the storage again the coating liquid discharged by the coating liquid discharge unit and stored in the recycle storage; and a waste liquid discard unit including a waste liquid tank, the waste liquid discard unit discarding the coating liquid stored in the recycle storage toward the waste liquid tank, wherein the circuitry controls:

the coating liquid recycle supply unit to supply the coating liquid, when the coating liquid is being applied to an object and a predetermined time has not elapsed since the coating liquid has been stored in the recycle storage; and the coating liquid recycle supply unit to supply the coating liquid and the waste liquid discard unit to discard the coating liquid, when the coating liquid is being applied to an object and the predetermined time has elapsed since the coating liquid has been stored in the recycle storage.

4. The coating device according to claim 1, wherein the circuitry controls, when the water supply unit supplies water, the pumper to pump up the coating liquid for a certain period of time.

5. The coating device according to claim 1, further comprising:

a straightening plate between the pumper and a bottom portion of the storage, the straightening plate including a surface portion facing a side wall of the storage and having a plurality of holes, wherein the temperature sensor and the viscosity sensor are disposed facing the surface portion of the straightening plate.

6. The coating device according to claim 5, wherein the water supply unit supplies water from the bottom portion of the storage.

7. The coating device according to claim 1, wherein the temperature sensor and the viscosity sensor are disposed close to each other, and a plurality of sets of the temperature sensor and the viscosity sensor are disposed at intervals in a longitudinal direction in which the pumper extends.

8. An image forming system comprising:

the coating device according to claim 1; and an image forming device.

* * * * *